(12) United States Patent
Suzuki

(10) Patent No.: US 6,479,400 B2
(45) Date of Patent: Nov. 12, 2002

(54) MANUFACTURING METHOD OF SYSTEM-ON-CHIP AND MANUFACTURING METHOD OF SEMICONDUCTOR DEVICE

(75) Inventor: Tatsuya Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/910,039

(22) Filed: Jul. 23, 2001

(65) Prior Publication Data

US 2002/0045356 A1 Apr. 18, 2002

(30) Foreign Application Priority Data

Jul. 27, 2000 (JP) ........................................ 2000-227065

(51) Int. Cl.[7] ............................................ H01L 21/302
(52) U.S. Cl. ........................................................ 438/749
(58) Field of Search ................................. 438/749, 275, 438/770, 756, 197, 199

(56) References Cited

U.S. PATENT DOCUMENTS 5,229,334 A  * 7/1993 Kato .......................... 437/239
5,811,334 A  * 9/1998 Buller et al. ................. 438/264
6,235,591 B1 * 5/2001 Balasubramanian et al. ..... 438/275
6,248,618 B1 * 6/2001 Quek et al. .................. 438/199

FOREIGN PATENT DOCUMENTS

| JP | 63-110640 | 5/1988 |
| JP | 11-112454 | 4/1998 |

* cited by examiner

*Primary Examiner*—David Nelms
*Assistant Examiner*—Quoc Hoang
(74) *Attorney, Agent, or Firm*—Sughrue Mion, PLLC

(57) ABSTRACT

A silicon substrate is cleaned under the conditions that an etching amount of the first gate insulating film 106 lying in a region 102 where the adjacent circuit is to be formed is, by the film thickness, not less than 0.01 nm but not greater than 0.2 nm. The cleaning achieves a high reliability for a thick film gate insulating film of an adjacent circuit in a semiconductor device such as a SOC, which comprises the adjacent circuit in which a MOS having the thick film gate insulating film made of layers of a first silicon oxide film (a first gate insulating film) 106 and a second silicon oxide film (a second gate insulating film) 110 is placed and an internal circuit in which a MOS having a thin film gate insulating film made of a second silicon oxide film 110 is placed.

9 Claims, 5 Drawing Sheets

MANUFACTURING METHOD OF SYSTEM-ON-CHIP AND MANUFACTURING METHOD OF SEMICONDUCTOR DEVICE

BACKGROUND OF THE INVENTION

The present invention is concerned with a method of manufacturing a semiconductor device including a system-on-chip (SOC), and more particularly with a method of manufacturing a system-on-chip (SOC) having a multiple gate system wherein MOSs (Metal Oxide Semiconductors) having a thick film gate insulating film and a thin film gate insulating film are placed in an adjacent circuit and an internal circuit, respectively.

With the progress of design and fabrication techniques for the IC (Integrated Circuit), extensive investigations have been, in recent years, conducted to develop what is called a system-on-chip (referred to as "SOC", hereinafter) wherein components accommodating on a single chip thereof can fulfill a system function which has, hitherto, required a systematic organization with a plurality of LSIs (Large Scale Integrated circuits).

IPs (Intellectual Properties) which may be incorporated into a SOC include a CPU (Central Processing Unit), a logic circuit, various memories with high storage capacities, voice and image processing circuits, circuits for various interfaces, a digital-analog hybrid signal processing circuit and so forth, and functional blocks of these sorts constitute an internal circuit thereof.

Nevertheless, as a conventional LSI, a SOC is also provided with an adjacent circuit having a function of input-output protection or such for the purpose of protecting the internal circuit from the ESD (Electro-Static Discharge), the current noise and the like.

Such an internal circuit and an adjacent circuit as described above, each comprising numerous MOSs, constitute a multiple gate system. In general, a gate insulating film of a MOS contained in the internal circuit is made thin to be 3 nm or less so as to achieve a high integration of the internal circuit.

In contrast with this, for a MOS contained in the adjacent circuit, what is necessitated is a high withstand voltage to attain a sufficient capability of the input-output protection. A gate insulating film in the adjacent circuit is, therefore, required to have a satisfactory insulating effect so that the gate insulating film in the adjacent circuit is made to become a thicker film than the gate insulating film in the internal circuit.

In practice, a film thickness generally regarded as being sufficient for the gate insulating film in the adjacent circuit is 5 nm or less. However, when a strong insulating effect is specially called for due to the presence of a high voltage such as a supply voltage, the film thickness thereof is, in some cases, set to be at least 5 nm but not greater than 7 nm.

Consequently, for the successful development of the SOC, it is essential to be able to manufacture well, on one and the same chip, the multiple gate system, wherein MOSs having the thick film gate insulating film and the thin film gate insulating film are placed in the adjacent circuit and the internal circuit, respectively.

Satisfying this requirement is a matter of great importance in the SOC fabrication. This can be explained as follows. Since many functional blocks are incorporated into a SOC, the demand for a higher integration in its internal circuit is particularly strong and, to achieve this, the gate insulating film therein is made extremely thin. This creates a large difference in film thickness between the gate insulating film in the internal circuit and the gate insulating film in the adjacent circuit. Then, in manufacturing a SOC, numerous MOSs having gate insulating films of very different film thickness must be formed on one and the same chip.

An example of a conventional method of manufacturing such a multiple gate system wherein gate insulating films are made of silicon oxide films is shown schematically in FIG. 6. The drawings herein illustrate, in sequence, the steps of forming, on the left 501 of a field oxide film 503, a MOS contained in an internal circuit and, on the right 502 of the field oxide film, a MOS contained in an adjacent circuit.

First, as shown in FIG. 6(a), a field oxide film for element isolation is formed on a silicon substrate 504.

Next, as shown in FIG. 6(b), the entire surface of the silicon substrate is subjected to oxidation and thereby, as first gate insulating films, silicon oxide films 505 and 506 are grown in the internal circuit and adjacent circuit, respectively.

After that, the silicon oxide film 505 lying in the internal circuit alone is removed, which brings about a structure shown in FIG. 6(c). In the vicinity of the surface of the gate insulating film with which the adjacent circuit is to be formed, impurities 507 such as particles and organic substances are present. Although impurities are also present in the vicinity of the surface of the silicon substrate in a region where the internal circuit is to be formed, they are herein omitted from the drawing.

Because these impurities may cause a pattern defect, a poor withstand voltage for the gate insulating film or such, these impurities are removed in a cleaning step. The structure after the removal of impurities is shown in FIG. 6(d).

Subsequently, the entire surface of the silicon substrate is again subjected to oxidation and thereby, as second gate insulating films, silicon oxide films 509 and 510 are grown in the internal circuit and the adjacent circuit, respectively. As shown in FIG. 6(e), this results in formation of a double layer of silicon oxide films which is to be formed into a thick film gate insulating film of the adjacent circuit, along with formation of a single layer of silicon oxide film which is to be formed into a thin film gate insulating film of the internal circuit.

Following that, a polysilicon film is deposited on the silicon oxide films and this obtained polysilicon film is then formed into gate electrodes 511 and 512 by means of photolithography or the like. Thereafter source-drain regions 513 to 516 are formed, accomplishing a SOC which has a MOS with a thick film gate insulating film in the adjacent circuit and another MOS with a thin film gate insulating film in the internal circuit, as shown in FIG. 6(f).

With respect to a cleaning agent which is used to remove impurities present in the vicinity of the surface of the gate insulating film with which the adjacent circuit is formed, an APM cleaning solution or a mixed solution of ammonia, hydrogen peroxide and ultrapure water is hitherto utilized. In this instance, it is considered that the solution removes particles by the mechanisms of (a) a lifting-off effect on particles resulting from etching and oxidation repeatedly applied to the surface of the gate insulating film, (b) an inhibitory effect on particle reattachment to the substrate surface due to the generation of a repulsive force therebetween by making the $\zeta$ potential of removed particles equal to the potential of the substrate surface, and the like.

Therefore, in order to obtain a clean surface of the gate insulating film with which the adjacent circuit is formed, it was supposed that a thorough particle lifting-off must be performed, in other words, the surface must be etched a great deal. This has so far led to setting of a high cleaning temperature and a long cleaning time period. In some cases, an etching amount of the gate insulating film even exceeded 0.2 nm in terms of film thickness.

However, when cleaning is performed in such conditions, although the particles may be successfully removed, the surface roughness of the gate insulating film may increase, as depicted by a wavy line 508 in FIG. 6(d), and the reliability of the gate insulating film in the adjacent circuit may decrease.

Furthermore, even if another oxidation or the like is subsequently applied thereto, the gate insulating film with the degraded surface cannot recover its quality and may only produce a gate insulating film with a low reliability.

The prime factor for that is presumably the generation of the electric field centralizations brought about by the unevenness which arises locally on the interface between the gate insulating film and the gate electrode. This probably results in the TDDB (Time Dependent Dielectric Breakdown) and lowers the reliability of the gate insulating film.

Now, in Japanese Patent Application Laid-open No. 112454/1998, it was disclosed that an object of an invention therein is to reduce roughness which is produced by etching in cleaning the surface of a silicon semiconductor substrate. There is also described, in the publication, matters concerning the degradation of the gate insulating film.

However, nothing is described in respect of a thick film gate insulating film contained in the adjacent circuit of the SOC or the like. Moreover, regarding the cleaning conditions, such as the cleaning temperature and the cleaning time period, only general aspects are mentioned and the control made over the etching amount of the gate insulating film is not described. Therefore, in some cases, the evenness of the thick film gate insulating film of the SOC or the like, in particular, may not be steadily achieved thereby.

Further, in Japanese Patent Application Laid-open No. 110640/1988, aiming at improvement upon controllability of the cleaning, there is proposed that, in the cleaning step with an APM cleaning solution being used, the cleaning is performed at ambient temperature while applying ultrasonic waves.

In the publication, however, nothing is described in respect of a thick film gate insulating film contained in the adjacent circuit of the SOC or the like. Moreover, nothing is mentioned concerning either the control made over the etching amount of the gate insulating film or the surface roughness of the gate insulating film. Therefore, in some cases, the evenness of the thick film gate insulating film of the SOC or the like, in particular, may not be steadily achieved thereby.

Therefore, if any of the conventional techniques including the above examples is used, good evenness cannot be steadily achieved for the gate insulating film after the cleaning, particularly in a semiconductor device equipped with both of a MOS having a thick film gate insulating film and a MOS having a thin film gate insulating film, such as a SOC, and in such a case, high reliability cannot be secured for the thick film gate insulating film.

SUMMARY OF THE INVENTION

Accordingly, an object of the present invention is to attain a high reliability for a thick film gate insulating film of an adjacent circuit in a semiconductor device such as a SOC, which comprises the adjacent circuit in which a MOS having the thick film gate insulating film is placed and an internal circuit in which a MOS having a thin film gate insulating film is placed.

In order to achieve the object, the present invention provides a method of manufacturing a system-on-chip (SOC) comprising an adjacent circuit in which a MOS having a thick film gate insulating film made of layers of a first gate insulating film and a second gate insulating film is placed and an internal circuit in which a MOS having a thin film gate insulating film made of a second gate insulating film is placed; which comprises the steps of:

(a) forming the first gate insulating film on a silicon substrate;

(b) removing the first gate insulating film lying in a region where said internal circuit is to be formed;

(c) cleaning said silicon substrate under the conditions that an etching amount of the first gate insulating film lying in a region where said adjacent circuit is to be formed is, by the film thickness, not less than 0.01 nm but not greater than 0.2 nm; and (d) forming the second gate insulating film on said silicon substrate.

Further, the present invention provides a method of manufacturing a semiconductor device wherein a first MOS and a second MOS having respective gate insulating films of different film thickness are laid on and incorporated into one and the same silicon substrate; which comprises the steps of:

(a) forming a first gate insulating film on said silicon substrate;

(b) removing the first gate insulating film lying in a region where said first MOS is to be formed;

(c) cleaning said silicon substrate under the conditions that an etching amount of the first gate insulating film lying in a region where said second MOS is to be formed is, by the film thickness, not less than 0.01 nm but not greater than 0.2 nm; and (d) forming a second gate insulating film on said silicon substrate.

The present invention provides a method of manufacturing a SOC comprising an adjacent circuit in which a MOS having a thick film gate insulating film made of layers of a first gate insulating film and a second gate insulating film is placed and an internal circuit in which a MOS having a thin film gate insulating film made of a second gate insulating film is placed, wherein a silicon substrate is cleaned under the conditions that an etching amount of a first gate insulating film lying in a region where the adjacent circuit is to be formed is, by the film thickness, not less than 0.01 nm but not greater than 0.2 nm. Consequently, excellent evenness can be steadily achieved for the first gate insulating film, and therefore, the reliability of the thick film gate insulating film can be enhanced.

DETAILED DESCRIPTION

The present inventors conducted comprehensive investigations on a method of cleaning a gate insulating film in an adjacent circuit of a SOC or the like, and successfully discovered that, by regulating the etching amount of the gate insulating film appropriately, particles present in the vicinity of the surface of the gate insulating film can be sufficiently removed and, at the same time, the surface of the gate insulating film can be made satisfactorily even.

As a result, in a semiconductor device such as a SOC, which comprises an adjacent circuit in which a MOS having a thick film gate insulating film is placed and an internal circuit in which a MOS having a thin film gate insulating film is placed, a high reliability can be attained for the thick film gate insulating film of the adjacent circuit.

As a first gate insulating film, a silicon oxide film, a silicon nitride film, a silicon oxynitride film or such can be employed but, among these films, a silicon oxide film is preferable.

These films can be grown by applying either thermal oxidation or thermal nitridation to a silicon substrate. It is also possible to apply both of them in various ways for the film growth. For example, thermal nitridation can be carried out after thermal oxidation of the silicon substrate is made, or thermal oxidation after thermal nitridation, or even thermal oxidation and thermal nitridation can be simultaneously performed.

Further, as a second gate insulating film, a silicon oxide film, a silicon nitride film, a silicon oxynitride film, a high dielectric constant film or such can be employed but, among these films, a silicon oxide film and a silicon oxynitride film are preferable.

In order to remove particles from any of these gate insulating films, particles must be lifted off as described above, and it was so far supposed that the gate insulating film must be etched a great deal in a cleaning step.

However, the present inventors demonstrated that only a small amount of etching of the gate insulating film, equivalent to 0.01 nm or over, and more preferably 0.05 nm or over, in terms of film thickness, is enough to remove particles satisfactorily.

Presumably, to remove a particle, it is unnecessary to lift off the whole one, but sufficient to expose a mere part of the one on the surface of the gate insulating film, although the reason for that is not very evident.

Meanwhile, to obtain a gate insulating film having a satisfactorily even surface in an adjacent circuit of a SOC, the etching amount of the gate 4 insulating film by the film thickness should be preferably not greater than 0.2 nm, more preferably not greater than 0.15 nm, and still more preferably not greater than 0.1 nm.

Figure 2A:
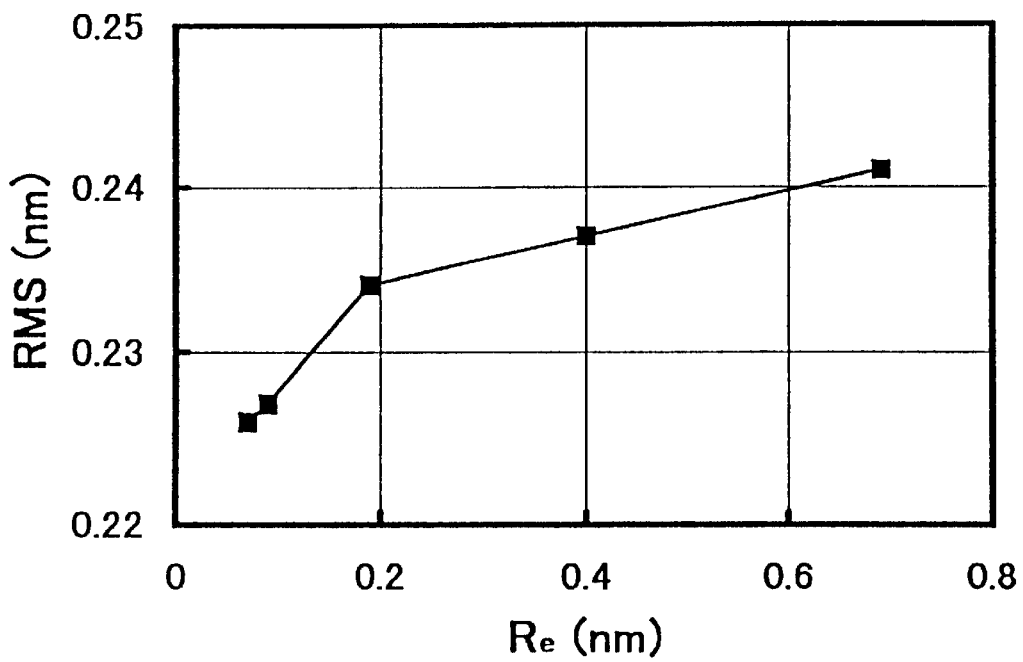
FIG. 2 is a pair of graphs showing $R_e$ dependences of RMS and $R_a$, respectively.
Figure 2B:
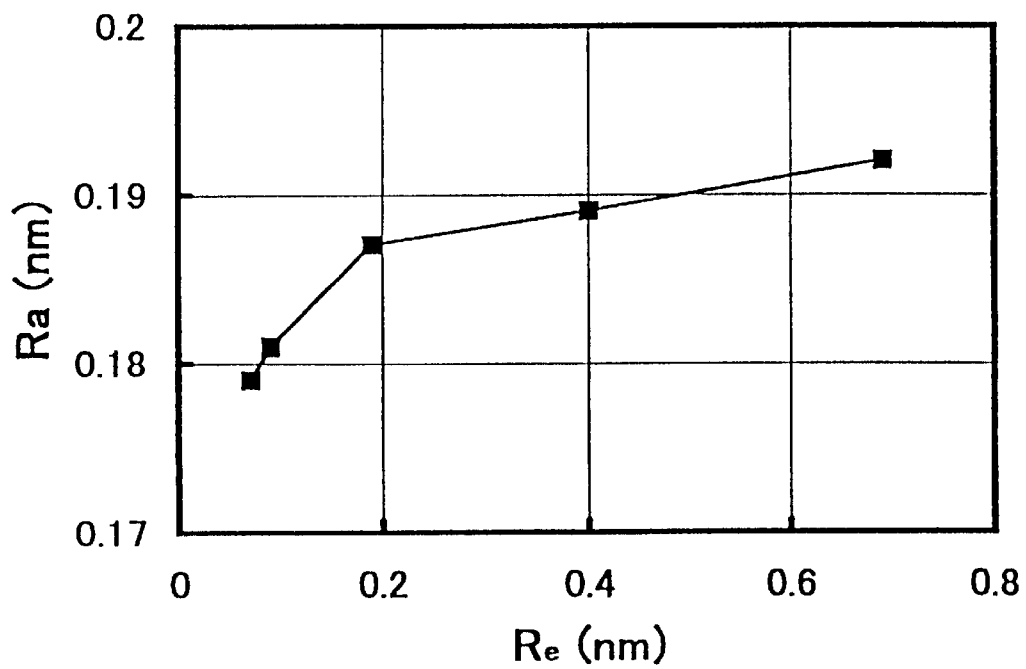

FIG. 2 shows dependences of the root mean square value of roughness (RMS) and the average value of roughness ($R_a$) of the gate insulating film surface upon the film thickness ($R_e$) of the portion of the gate insulating film eroded away by etching.

The measurement of the film thickness (nm) may be made with an ellipsometer or the like, and the $R_e$(nm), as the etching amount, may be calculated from the difference between the film thicknesses before and after the cleaning. As for the RMS and the $R_e$, the evenness of the sample surface may be measured, using an atomic force microscope (ATM), and then respective averages of these estimated values may be obtained by calculation.

As seen dearly in FIG. 2($a$), the RMS can be made smaller by reducing the $R_e$. When the $R_e$ is set to be 0.2 nm or less, the RMS can be made equal to or less than 0.235 nm, and when the $R_e$ is set to be 0.1 nm or less, the RMS can be made equal to or less than 0.228 nm.

As long as the RMS of a gate insulating film is kept equal to or less than 0.235 nm, it is possible to fabricate the thick film gate insulating film with a high reliability in the adjacent circuit, by applying another oxidation and/or nitridation thereto or the like.

Further, as seen dearly in FIG. 2($b$), the $R_a$ can be made smaller by reducing the $R_e$ (nm). When the $R_e$ is set to be 0.2 nm or less, the $R_a$ can be made equal to or less than 0.188 nm, and when the $R_e$ is set to be 0.1 nm or less, the $R_a$ can be made equal to or less than 0.182 nm.

As long as the $R_a$ of a gate insulating film is kept equal to or less than 0.188 nm, it is possible to fabricate the thick film gate insulating film with a high reliability in the adjacent circuit, by applying another oxidation and/or nitridation thereto or the like.

The prime factor for the above change is presumably less frequent occurrences of the electric field centralizations, resulting from a new introduction of the control over the unevenness which may arise locally on the interface between the gate insulating film and the gate electrode. Consequently, the TDDB is suppressed and the reliability of the gate insulating film, enhanced.

Figure 3:
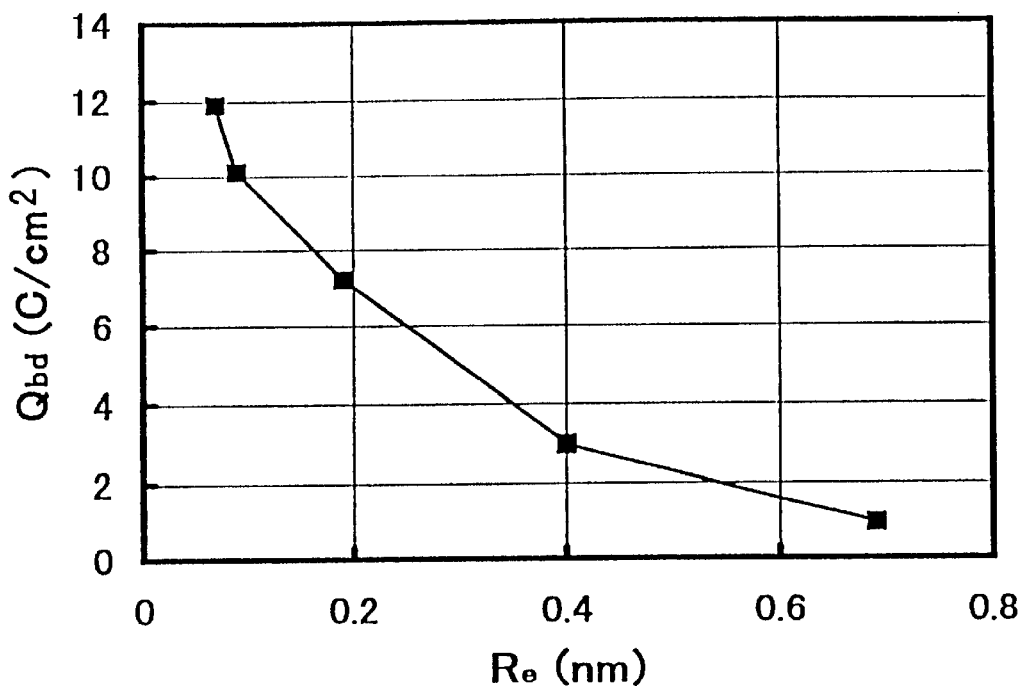
FIG. 3 is a graph showing $R_e$ dependence of $Q_{bd}$.

FIG. 3 shows the dependence of the amount of transmitted electric charge for breakdown ($Q_{bd}$) of the gate insulating film upon the $R_e$. The $Q_{bd}$ herein stands for the amount of cumulative electric charge (C/m$^2$) required to break down 50% of a given number of gate insulating films, and its measurement is made according to the constant current TDDB method.

To secure a satisfactory reliability for a SOC, $Q_{bd}$ is made to be preferably not less than 7 C/cm$^2$ and more preferably not less than 10 C/cm$^2$.

As seen dearly in FIG. 3, the $Q_{bd}$ can be enhanced by reducing the $R_e$. When the $R_e$ is set to be 0.2 nm or less, the $Q_{bd}$ can be made equal to or greater than 7 C/cm$^2$, and when the $R_e$ is set to be 0.1 nm or less, the $Q_{bd}$ can be made equal to or greater than 10 C/cm$^2$.

Now, a manufacturing method of the present invention for a SOC wherein gate insulating films are made of silicon oxide film is schematically described with reference to FIG. 1.

A SOC to be manufactured comprises an internal circuit 101 having a function as a logic, a memory or the like and an adjacent circuit 102 having a function of input-output protection or the like. While a gate insulating film of a first MOS placed in the internal circuit is thinner than a gate insulating film of a second MOS placed in the adjacent circuit and is not greater than 3 nm in thickness, the gate insulating film of the second MOS placed in the adjacent circuit is thicker than the gate insulating film of the first MOS placed in the internal circuit and is not greater than 7 nm in thickness.

Since the gate insulating film has been being made thinner as ever, with attempts to achieve a still higher integration of a circuit proceeding, the lower limit for the film thickness thereof is not specifically set herein. The film thickness can be 1 nm or even less.

Figure 1A:
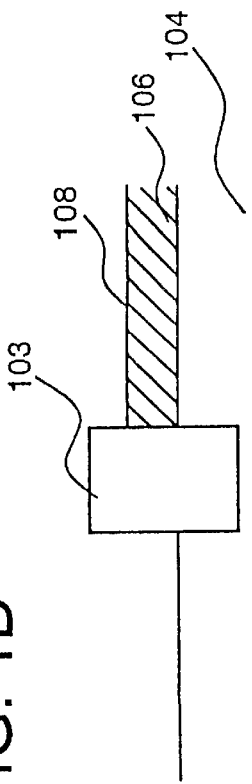
FIG. 1 is a series of schematic cross-sectional views illustrating the steps of a manufacturing method of the present invention.
Figure 1B:
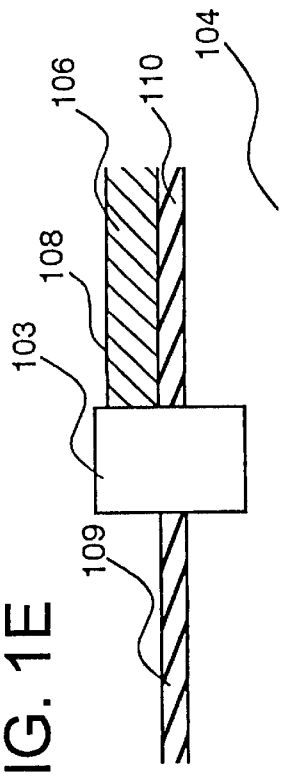

Firstly, as shown in FIG. 1(a), a field oxide film 103 is formed on a silicon substrate 104 and then, as shown in FIG. 1(b), with oxidation applied to the entire surface of the silicon substrate, first silicon oxide films 105 and 106 are grown, as first gate insulating films, in an internal circuit and an adjacent circuit, respectively, to a thickness required for the gate insulating film in the adjacent circuit. The film thickness of the first gate insulating film is generally 7 nm or less.

Next, a resist with a thickness of 1 μm or so is formed and by developing this resist an opening is made over the silicon oxide film 105. Using a chemical solution such as buffered hydrochloric acid, wet etching is then performed and the silicon oxide film 105 is removed, and thereafter the resist is peeled off. The structure obtained here at is schematically shown in FIG. 1(c).

Figure 1C:
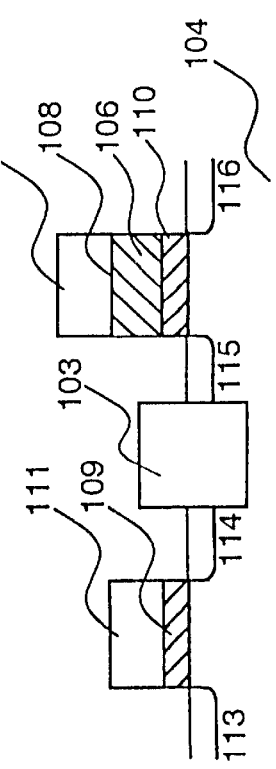

As schematically shown in FIG. 1(c), in the vicinity of the surface of the gate insulating film with which the adjacent circuit is to be formed, impurities 107 such as particles and organic substances are present and these are removed by cleaning. Although impurities are also present in the vicinity of the surface of the silicon substrate in a region where the internal circuit is to be formed, they are herein omitted from the drawing.

The cleaning conditions are not specifically limited as long as the etching amount of the gate insulating film is, in terms of film thickness, not less than 0.01 nm but not greater than 0.2 nm. Nevertheless, to meet this requirement, it is preferable to satisfy at least one of the following conditions.

With respect to the cleaning temperature, provided that it is in the range to allow the etching amount in terms of film thickness to be not less than 0.01 nm but not greater than 0.2 nm so that an even etching face may be attained, any specific limitation is not present. It is possible to set either at a relatively low temperature that is at least 20° C. but not higher than 45° C. or at a relatively high temperature that is higher than 45° C. but not higher than 90° C.

Figure 4:
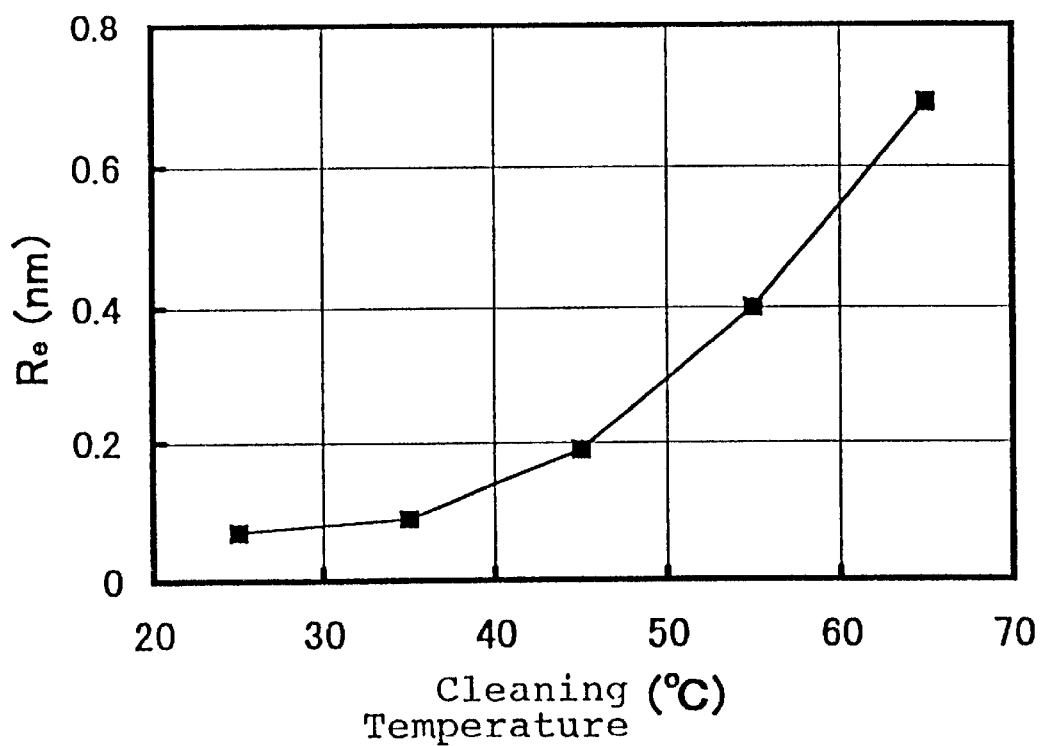
FIG. 4 is a graph showing $R_e$ as a function of the cleaning temperature.

FIG. 4 shows the change of the $R_e$ as a function of the cleaning temperature with a fixed cleaning time period of 10 minutes. This plot indicates that the $R_e$ can be reduced by lowering the cleaning temperature (° C.). When the cleaning temperature is set at or below 45° C., the film thickness of the portion of the gate insulating film eroded away by etching can be made equal to or less than 0.2 nm. Further, when the cleaning temperature is set at or below 35° C., the film thickness of the portion of the gate insulating film eroded away by etching can be made equal to or less than 0.1 nm.

Moreover, if the cleaning temperature is set at 25° C., an elaborate apparatus for thermoregulation becomes unnecessary, which is an additional advantage.

Further, in the case that the cleaning temperature is set low, ultrasonic waves with an energy of not less than 300 W but not greater than 1000 W may be applied, if circumstances require. Application of ultrasonic waves can facilitate particles which are partly exposed on the surface of the gate insulating film to detach from the gate insulating film and, thus, improve the cleaning efficiency.

In this instance, the use of a low cleaning temperature allows the etching surface to achieve good evenness and the application of ultrasonic waves makes it possible to attain an appropriate etching rate.

The cleaning time period is determined, depending on the cleaning temperature, and, if it is in the range to allow a prescribed etching amount to be achieved, no other specific limitation is present. However, there are some occasions that certain cleaning time periods drastically affect the etching amounts so that it is necessary to select the optimum time period with great care.

For example, when the cleaning temperature is set at a relatively low temperature that is at least 20° C. but not higher than 45° C., the cleaning time period is the optimum in the range that is at least 1 minute but not longer than 20 minutes. Meanwhile when the cleaning temperature is set at a relatively high temperature that is higher than 45° C. but not higher than 90° C., the cleaning time period is the optimum in the range that is at least 30 seconds but not longer than 5 minutes.

Further, when the cleaning is carried out at 25° C., the cleaning time period is the optimum in the range that is at least 1 minute but not longer than 15 minutes.

Figure 5:
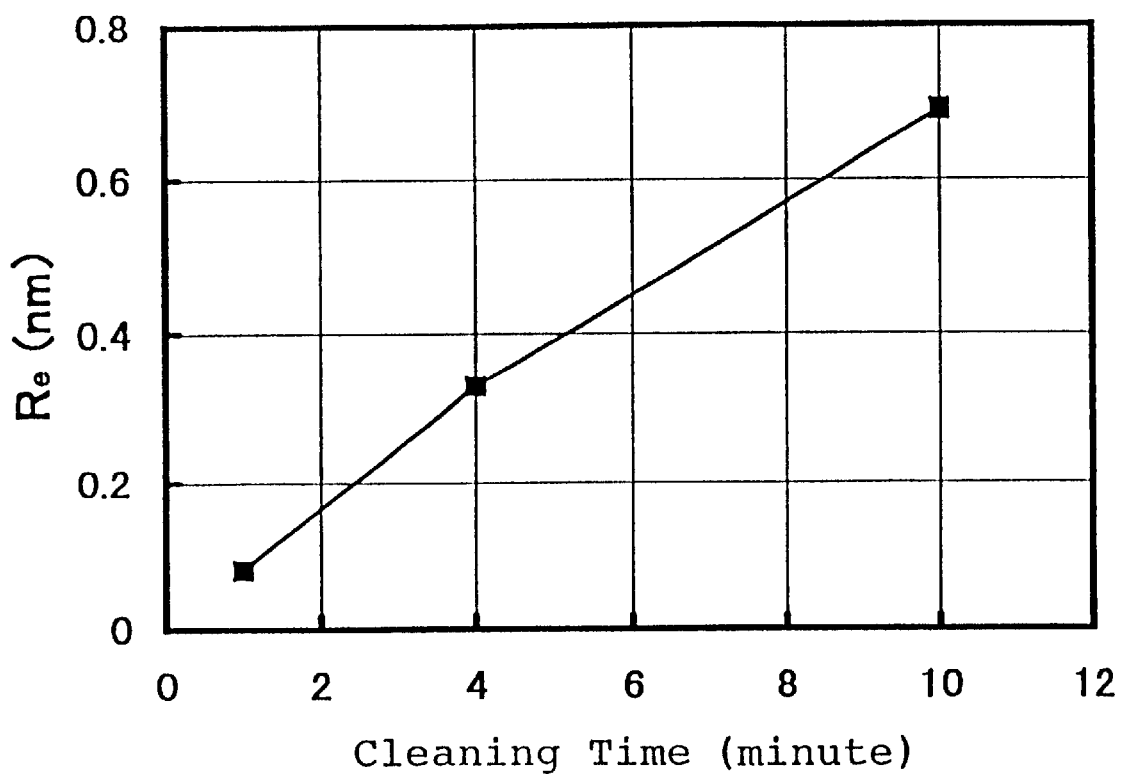
FIG. 5 is a graph showing $R_e$ as a function of the cleaning time period.
Figure 6A:
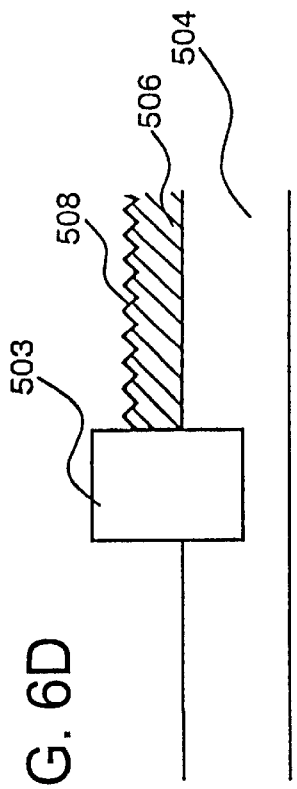
FIG. 6 is a series of schematic cross-sectional views illustrating the steps of a conventional manufacturing method.
Figure 6B:
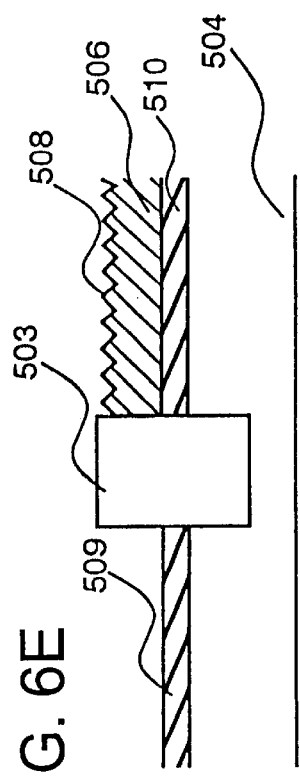
Figure 6C:
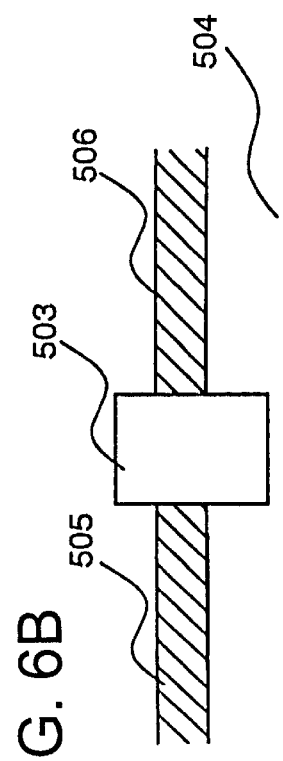
Figure 6D:
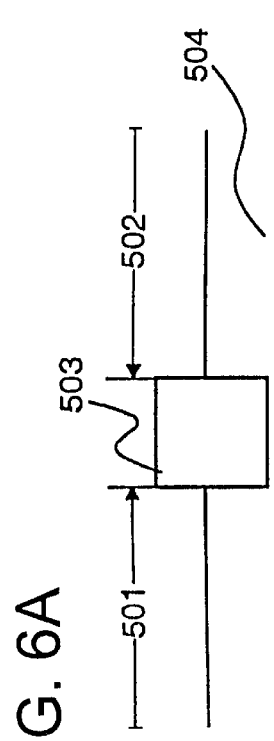
Figure 6E:
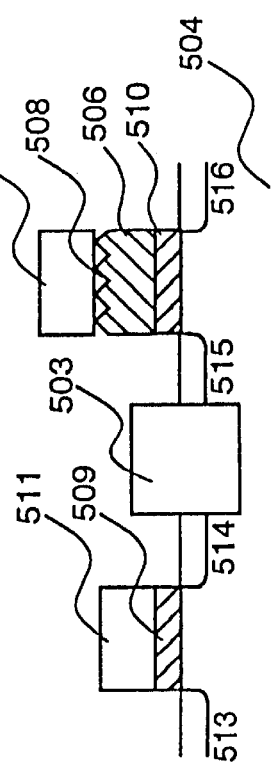
Figure 6F:
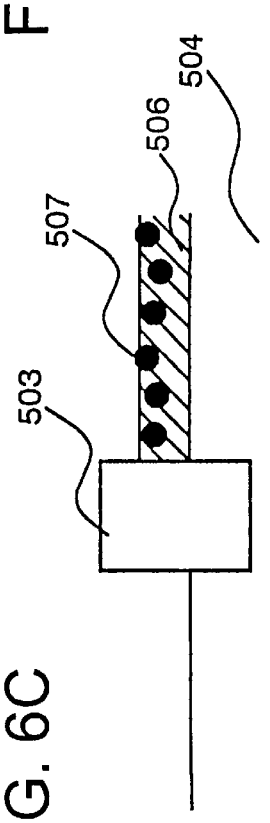

FIG. 5 shows the change of the $R_e$ as a function of the cleaning time period with a cleaning temperature fixed at 65° C. This plot indicates that the $R_e$ can be reduced by shortening the cleaning time period (minutes). When the cleaning time period is set to be 2 minutes 30 seconds or shorter, the film thickness of the portion of the gate insulating film eroded away by etching can be made equal to or less than 0.2 nm. Further, when the cleaning time period is set to be 1 minute 10 seconds or shorter, the film thickness of the portion of the gate insulating film eroded away by etching can be made equal to or less than 0.1 nm.

In regard of the cleaning agent, as long as the agent can etch the gate insulating film and the remaining surface thereof is even in form, any agent is not particularly limited. An APM cleaning solution is, however, preferable because its etching rate can be easily controlled.

As examples for the mixture ratio (by volume) of the ammonia, hydrogen peroxide and ultrapure water, 1/4/20, 1/1/50, 1/1/5, 0.15/1/5 and the like can be given. However, according to the present inventors' observation, the mixture ratio of the APM cleaning solution hardly affect characteristics of the obtained gate insulating film, as far as the cleaning method satisfies the above conditions.

In consequence, even if the amount of ammonia or hydrogen peroxide in the APM cleaning solution diminishes through consumption, volatilization or such, while cleaning proceeds, characteristics of the obtained gate insulating film are hardly altered so that a stable productivity can be acquired.

Figure 1D:
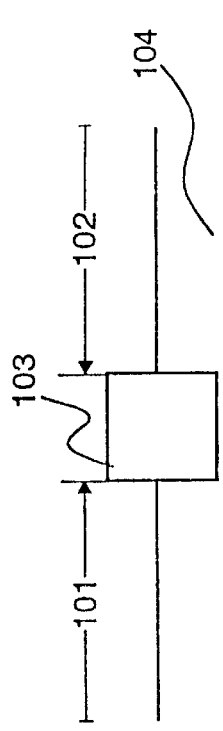

By employing one or more conditions among the above conditions, according to the circumstances, a gate insulating film with such an even etching face as indicated schematically by a straight line 108 in FIG. 1(d) can be obtained.

After particles are removed, removal of metal impurities are successively carried out, using a so-called HPM cleaning solution that is a mixed solution of hydrochloric add, hydrogen peroxide and ultrapure water.

Subsequently, the entire surface of the silicon substrate is once more subjected to oxidation, and second silicon oxide films 109 and 110 are grown, as second gate insulating films, in the internal circuits and the adjacent circuit, respectively. The film thickness of the second gate insulating film is generally 3 nm or less.

Figure 1E:
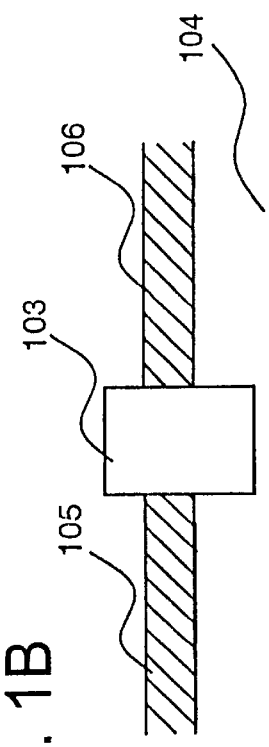

As a result, as shown in FIG. 1(e), there may be formed a double layer consisting of silicon oxide films 106 and 110 in the adjacent circuit and a single layer consisting of a silicon oxide film 109 in the internal circuit.

The double layer of silicon oxide films in the adjacent circuit is to be formed into a thick film gate insulating film, and the total film thickness of the double layer of silicon oxide films is greater than the film thickness of a thin film gate insulating film and is normally set to be 7 nm or less. On the other hand, the single layer of a silicon oxide film in the internal circuit is to be formed into a thin film gate insulating film, and the film thickness thereof is smaller than the film thickness of the thick film gate insulating film and is normally set to be 3 nm or less.

Further, if circumstances require, a silicon oxynitride film may be formed as a second gate insulating film, by applying oxynitridation to the entire surface of the silicon substrate.

Now, on the silicon oxide film obtained by the above steps, a polysilicon film is deposited by the low-pressure CVD (Chemical Vapour Deposition) method or the like. In some cases, N-type dopants such as phosphorus, arsenic or the like may be added, while or after growing the polysilicon film.

The obtained polysilicon film is formed into gate electrodes 111 and 112 by means of photolithography or the like.

Subsequently, using the gate electrodes as masks, source-drain regions 113 to 116 are formed by the thermal diffusion method and the ion implantation method, which accomplishes the structure shown in FIG. 1(f).

If required, a functional layer, such as a gettering layer, an anti-diffusion layer, an etching stopper layer or the like, can be additionally set therein.

The above manufacturing method of the present invention is described, taking a case of a SOC. However, a manufacturing method of the present invention can be applied to any multiple gate system wherein MOSs having gate insulating films of different film thickness are placed and can achieve high reliability for the gate insulating films therein.

Further, as an example for a semiconductor device having a multiple gate system, an element equipped with either one or both of a SOC and a DRAM can be given.

My invention is further illustrated by the following examples. As for reagents, commercially available products of high purity are utilized, unless otherwise mentioned.

EXAMPLE I

Fabrication of SOC 1

Thermal oxidation is applied to the entire surface of a silicon substrate 104 under the conditions that a temperature is 900° C. and a period is 10 minutes, and silicon oxide films 105 and 106 with a film thickness of 5.1 nm are formed, as shown in FIG. 1(b). After that, using a mixed solution of HF, NH$_4$F and H$_2$O (with a mass ratio of 5/14/20) as buffered hydrofluoric acid, a silicon oxide film 105 alone is removed.

Next, using a mixed solution of ammonia, hydrogen peroxide and ultrapure water (with a volume ratio of 1/4/20) as an APM cleaning solution, cleaning is carried out at 25° C. for 10 minutes, while applying ultrasonic waves with an energy of 700 W, and thereby a silicon oxide film 106 is etched by 0.07 nm.

The RMS and R$_a$ of the silicon oxide film surface after cleaning are 0.226 nm and 0.179 nm, respectively, which confirms high evenness of the film.

Following that, using a mixed solution of hydrochloric acid, hydrogen peroxide and ultrapure water (with a volume ratio of 1/1/6) as a HPM cleaning solution, metal impurities are removed.

Subsequently, another thermal oxidation is performed under the conditions that a temperature is 800° C. and a period is 8 minutes, and thereby the structure shown in FIG. 1(e) is accomplished. The film thicknesses of silicon oxide films 109 and 110 are 2.5 nm each and the total film thickness of the silicon oxide films 106 and 110 is 6.0 nm.

Polysilicon is then grown to a thickness of 20 nm by the low pressure CVD method under the conditions that a gas ratio of PH$_3$ to SiH is 0.001, a growth temperature is 700° C. and a pressure of atmosphere is 1.3 kPa, and formed into a shape of gate electrodes. Formation of source-drain regions is carried out by the ion implantation method under the conditions that an energy is 150 keV and a dose is $2.0 \times 10^{13}$ atoms/cm$^2$.

Figure 1F:
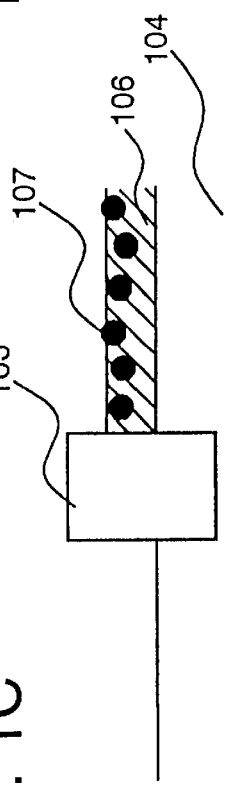

A SOC having a structure shown schematically in FIG. 1(f) is, thus, fabricated. The film thickness of a gate insulating film of a MOS placed in an adjacent circuit of the SOC 1 is 6.0 nm and the film thickness of a gate insulating film of another MOS placed in an internal circuit is 2.5 nm. Further, the Q$_{bd}$ of the gate insulating film of the MOS placed in the adjacent circuit is 11.9 C/cm$^2$, which confirms high insulating capacity of this film.

EXAMPLE II:

Fabrication of SOC 2

A SOC 2 is manufactured in the same way as the SOC 1 except that a cleaning temperature is set to be 65° C. and a cleaning time period 1 minute for the cleaning with the APM cleaning solution.

The R$_e$ is as small as 0.08 nm and the film thickness of a gate insulating film of a MOS placed in an adjacent circuit is 5.9 nm and the film thickness of a gate insulating film of another MOS placed in an internal circuit is 2.5 nm.

Further, the RMS and R$_a$ are as small as 0.226 nm and 0.180 nm, respectively, and the Q$_{bd}$ is as high as 11.6 C/cm$^2$.

EXAMPLE III:

Fabrication of SOC 3

A SOC 3 is manufactured in the same way as the SOC 2 except that a cleaning time period for the cleaning with the APM cleaning solution is set to be 10 minutes.

The R$_e$ is as large as 0.69 nm and the film thickness of a gate insulating film of a MOS placed in an adjacent circuit is 5.4 nm and the film thickness of a gate insulating film of another MOS placed in an internal circuit is 2.5 nm.

Further, the RMS and R$_a$ are as large as 0.241 nm and 0.192 nm, respectively, and the Q$_{bd}$ is as low as 0.94 C/cm$^2$.

EXAMPLE IV:

Fabrication of SOC 4 and SOC 5

A SOC 4 and a SOC 5 are manufactured in the same way as the SOC 1 except that a cleaning temperatures for the cleaning with the APM cleaning solution are set to be 35° C. and 45° C., respectively.

In the case of the SOC 4, the R$_e$ is as small as 0.09 nm, the RMS and R$_a$ are not more than 0.227 nm and 0.181 nm, respectively, and the Q$_{bd}$ is as high as 10.1 C/cm$^2$.

Further, the film thickness of a gate insulating film of a MOS placed in an adjacent circuit is 5.9 nm and the film thickness of a gate insulating film of another MOS placed in an internal circuit is 2.5 nm.

In the case of the SOC 5, the R$_e$ is as small as 0.19 nm, the RMS and R$_a$ are not more than 0.234 nm and 0.187 nm, respectively, and the Q$_{bd}$ is as high as 7.2 C/cm$^2$.

Further, the film thickness of a gate insulating film of a MOS placed in an adjacent circuit is 5.8 nm and the film thickness of a gate insulating film of another MOS placed in an internal circuit is 2.5 nm.

EXAMPLE V:

Fabrication of SOC 6

A SOC 6 is manufactured in the same way as the SOC 1 except that silicon oxynitride films are substituted for the silicon oxide films 109 and 110, and the SOC 6 demonstrates the same excellent performance as the SOC 1.

What is claimed is:

1. A method of manufacturing a system-on-chip (SOC) comprising an adjacent circuit in which a MOS (Metal Oxide Semiconductor) having a thick film gate insulating film made of layers of a first gate insulating film and a second gate insulating film is placed and an internal circuit in which a MOS having a thin film gate insulating film made of a second gate insulating film is placed; which comprises the steps of:

(a) forming the first gate insulating film on a silicon substrate;

(b) removing the first gate insulating film lying in a region where said internal circuit is to be formed;

(c) cleaning said silicon substrate under the conditions that an etching amount of the first gate insulating film lying in a region where said adjacent circuit is to be formed is, by the film thickness, not less than 0.01 nm but not greater than 0.2 nm; and (d) forming the second gate insulating film on said silicon substrate.

2. A method of manufacturing a system-on-chip (SOC) according to claim 1; wherein a thickness of the thin film gate insulating film, smaller than a thickness of the thick film gate insulating film, is not greater than 3 nm, and the thickness of the thick film gate insulating film, greater than the thickness of the thin film gate insulating film, is not greater than 7 nm.

3. A method of manufacturing a system-on-chip (SOC) according to claim 1, wherein a thickness of the first gate insulating film is not greater than 7 nm, and a thickness of the second gate insulating film is not greater than 3 nm.

4. A method of manufacturing a semiconductor device wherein a first MOS and a second MOS having respective gate insulating films of different film thickness are laid on and incorporated into one and the same silicon substrate; which comprises the steps of:

(a) forming a first gate insulating film on said silicon substrate;

(b) removing the first gate insulating film lying in a region where said first MOS is to be formed;

(c) cleaning said silicon substrate under the conditions that an etching amount of the first gate insulating film lying in a region where said second MOS is to be formed is, by the film thickness, not less than 0.01 nm but not greater than 0.2 nm; and (d) forming a second gate insulating film on said silicon substrate.

5. A method of manufacturing a semiconductor device according to claim 4, wherein a thickness of the first gate insulating film is not greater than 7 nm, and a thickness of the second gate insulating film is not greater than 3 nm.

6. A method of manufacturing a semiconductor device according to claim 4, wherein a cleaning temperature is at least 20° C. but not higher than 45° C., and a cleaning time period is at least 1 minute but not longer than 20 minutes.

7. A method of manufacturing a semiconductor device according to claim 4, wherein a cleaning temperature is higher than 45° C. but not higher than 90° C., and a cleaning time period is at least 30 seconds but not longer than 5 minutes.

8. A method of manufacturing a semiconductor device according to claim 4, wherein, in said step of cleaning, ultrasonic waves with an energy of not less than 300 W but not greater than 1000 W are applied thereto.

9. A method of manufacturing a semiconductor device according to claim 4, wherein said semiconductor device is equipped with either one or both of a system-on chip (SOC) and a DRAM (Dynamic Random Access Memory).

* * * * *